(12) United States Patent
Hung

(10) Patent No.: US 6,330,254 B1
(45) Date of Patent: *Dec. 11, 2001

(54) OPTICAL TUNER

(75) Inventor: Henry Hung, Paradise Valley, AZ (US)

(73) Assignee: Micro Photonic Integration Corporation, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/644,419

(22) Filed: Aug. 23, 2000

Related U.S. Application Data

(63) Continuation of application No. 09/630,420, filed on Aug. 1, 2000, which is a continuation of application No. 09/629,523, filed on Aug. 1, 2000.

(51) Int. Cl.[7] .................................................. H01S 3/10
(52) U.S. Cl. ...................................... 372/20; 372/98
(58) Field of Search .............................. 372/20, 82, 32, 372/98

*Primary Examiner*—Leon Scott, Jr.
(74) *Attorney, Agent, or Firm*—Donald J. Lenkszus

(57) ABSTRACT

A tuner for optical signals comprises a surface acousto-optic tunable filter utilized to provide signals indicative of the wavelength of the optical signals, a tunable filter, and a processor responsive to the wavelength indicating signals to control the tunable filter such that the tunable filter passes only optical signals at a predetermined wavelength.

12 Claims, 5 Drawing Sheets

OPTICAL TUNER

This application is a continuation of application Ser. No. 09/630,420, filed Aug. 01, 2000, which is a continuation of application Ser. No. 09/629,523, filed Aug. 01, 2000.

FIELD OF THE INVENTION

This invention pertains to optical systems, in general, and to wavelength tunable light sources for such systems, in particular. Even more particularly, the present invention pertains to an optical tuner for use in such systems.

BACKGROUND OF THE INVENTION

The term "optical system" as used herein refers to any system that utilizes light waves to convey information between one node and one or more other nodes.

Telecommunications carriers bean installing optical fiber cable about 15 years ago. At the time the optical fiber cables were installed, it was expected that the optical fiber infrastructure would provide communications systems and networks with ample capacity for the foreseeable future. However, the phenomenal growth of data traffic on the Internet has taxed the capabilities of the optical fiber infrastructure. In addition, new high bandwidth applications are being developed and are being made available for corporate applications. The result of this increased usage of the fiber infrastructure is serious network congestion and exhaustion of the fiber infrastructure. In the past, optical fiber systems relied on time division multiplexing to route traffic through a channel. Time division multiplexed systems add more capacity by time multiplexing signals onto an optical fiber. A disadvantage of time division multiplex systems is that data must be converted from light waves to electronic signals and then back to light. The system complexity is thereby increased.

Wavelength Digital Multiplexing (WDM) and Dense Wavelength Digital Multiplexing (DWDM) are being used and/or proposed for use in long-haul telecom network applications for increasing the capacity of existing fiber optic networks. The advantage of both WDM and DWDM is that conversion to electrical signals is not necessary. The devices that handle and switch system traffic process light and not electrical signals. In WDM, plural optical channels are carried over a single fiber optic, with each channel being assigned to a particular wavelength. Each transmitter includes a laser that is intended to operate at only one of the allowed wavelength channel frequencies. Each laser is engineered to operate within the channel specifications for the life or the system. For repair purposes, an inventory of transmitters for each wavelength channel must be maintained. As the number of channels increases, the size of the inventory likewise increases. DWDM is a WDM system in which channel spacing is on the order of one nanometer or less. WDM and DWDM expand the capacity of an optical fiber by multiple wavelength channels into a single laser beam. Each wavelength is capable of carrying as much traffic as the original. The need for maintaining a large inventory of transmitters is likewise an issue for DWDM systems.

It is highly desirable to provide a tunable optical transmitter as well as a tunable light source.

SUMMARY OF THE INVENTION

In accordance with the principles of the invention, a tunable optical transmitter including a tunable light source is provided. The tunable light source includes a gain media connected in an optical loop and a tunable filter inserted in the loop. A modulator is coupled into the loop and provides for modulating tuned optical signals obtained from the loop. In accordance with one aspect of the invention, a Mach-Zehnder interferometer type modulator is utilized to modulate the optical signals. A wavelength sensor is coupled into the loop and provides wavelength indicative signals that a processing unit utilizes in accordance with a predetermined algorithm to determine the wavelength of optical signals in the loop. The processing unit utilizes the wavelength indicative signals to determine control signals to be provided to the tunable filter to adjust the filter such that the wavelength of optical signals in the loop are at a pre-selected wavelength.

In accordance with one aspect of the invention, the sensor is an acoustic optical tuning filter that is operated by the processing unit in accordance with a predetermined algorithm to determine the wavelength of optical signals. The processing unit is utilized to apply the algorithm to signals indicative of the wavelength of optical signals to determine the wavelength of optical signals in the loop, compare the wavelength to a desired wavelength and to control the tunable filter to adjust the wavelength of signals in the loop.

In one embodiment of the invention, the tunable filter is a two stage filter that includes a first stage acoustic optical filter and a second stage filter that is an unbalanced Mach-Zehnder interferometer. The first stage filter is a bandpass filter and the second stage filter is a comb filter. The combination of the two stages produces a narrow bandpass filter.

In another embodiment of the invention, the two-stage filter is provided by a bi-directional reflective tunable filter.

In yet another embodiment of the invention, a two-stage filter is inserted in cascade with the optical loop. In one embodiment of the invention, an Erbium doped fiber amplifier is utilized as the gain media. A light source provides pumping to the gain media.

An integrated optical device in accordance with the invention comprises a substrate that carries at least the tunable filter and sensor. The sensor comprises an acousto-optic tunable filter. Embodiments of the invention include a Mach-Zehnder interferometer on the integrated optic device. In addition, at least a portion of a gain media may also be integrated onto the same substrate as the integrated optic device. In accordance with another aspect of the invention, the integrated optical device is micro-machined to provide a reflective surface for the bi-directional tunable filter.

BRIEF DESCRIPTION OF THE DRAWING

The invention will be better understood from a reading of the following detailed description in conjunction with drawing, in which like reference designations in the various drawing figures are used to identify like elements, and in which.

DETAILED DESCRIPTION

Figure 1:
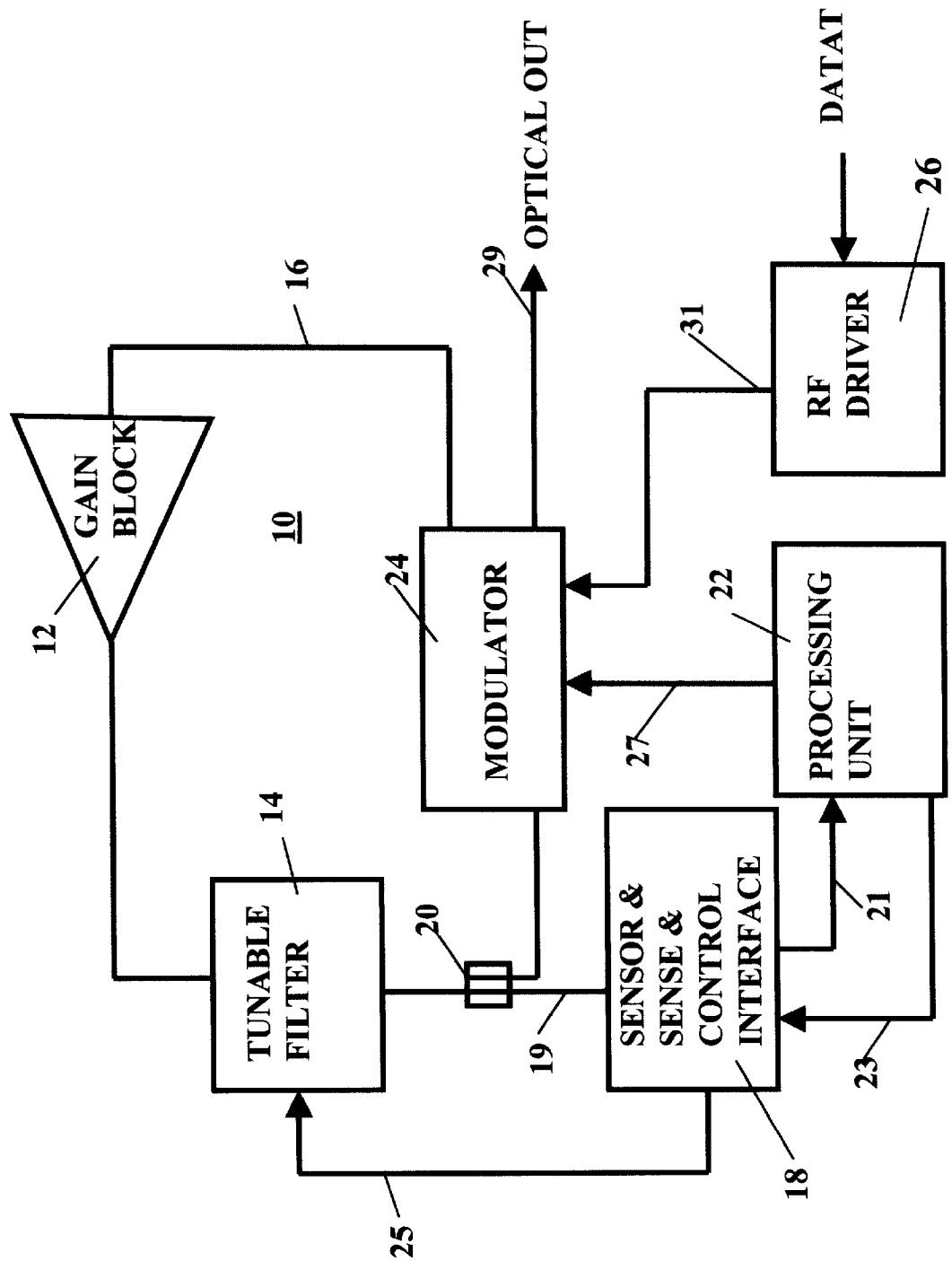
FIG. 1 is a block diagram of a tunable transmitter in accordance with the principles of the invention.

Referring now to the Drawing, a block diagram of a tunable optical transmitter 10 in accordance with the principles of the invention is shown. Transmitter 10 includes an optical gain block 12 connected in a loop configuration with a tunable filter 14. The optical gain block 12 can be any one of a number of different optical gain blocks, including, but not limited to, a rare earth doped fiber amplifier such as an Erbium doped fiber amplifier. Erbium doped fiber amplifiers are particularly well suited for the arrangement of FIG. 1 and may include a laser or lamp that provides optical pumping. The optical gain block is coupled in a loop 16. Loop 16 is an optical waveguide that may advantageously be, but is not limited to, optical fiber. In other configurations of the invention, the waveguide may be any type of waveguide alone or in combination with reflectors and/or optical fiber. The optical fiber may in some instances advantageously be a polarization maintaining fiber, such as a Fujikura "PANDA" polarization preserving fiber but the principles of the invention are not limited to the use of any particular fiber characteristic. A tunable filter 14 is connected in cascade with loop 16 and is utilized to tune the optical signal to a desired wavelength. Tunable fiber 14 may be any one of a number of tunable optical filters that are commercially available. In a particularly advantageous implementation of the invention an optical sensor is coupled into loop 16. As shown in FIG. 1, the optical sensor is included with a sense and control interface 18. The sensor of sensor and sense and control interface 18 is utilized as a wavelength sensor to provide for the measurement of the actual wavelength of optical signals in loop 16. The sensor and sense and control interface 18 receives a small portion of the optical signal from loop 16 via an optical coupler 20. Optical coupler 20 is coupled to tunable filter 14 by fiber 19 and taps loop 16. The sensor may be any one of a number of commercially available sensors, including, but not limited to Fabry-Perot type sensors. Sensor and sense and control interface 18 provides wavelength indicative signals to a processing unit 22 via line 21. Processing unit 22 may be a commercially available micro-controller or microprocessor. Processing unit 22 is programmed in accordance an algorithm that utilizes the wavelength indicative signals from sensor and sense and control interface 18 to determine the wavelength of optical signals, compare the determined wavelength with a selected predetermined wavelength and to control tunable filter 14 via line 23 to sensor and sense and control interface 18 and via line 25 so that the wavelength of optical signals in loop 16 is the selected predetermined wavelength. The predetermined wavelengths that are selected can, for instance be the channel wavelengths in a communication system. The processing unit can have the various predetermined wavelengths stored in a memory of the processing unit 22 and the selection of one of the predetermined wavelengths may be accomplished by any one of a variety of known ways to input selection information into a processing unit 22. In other embodiments of the invention, processing unit 22 may have the predetermined wavelength information downloaded into memory, or a memory device may be programmed with the selection information and added to the processing unit 22. Although a memory for the processing unit 22 is not shown, it will be understood by those skilled in the art that processing unit 22 may include one or more memories that may be of various types including read only memory and random access memory. In addition, processing unit 22 may include one or more microprocessors.

The combination of gain block 12, tunable filter 14 and loop 16 along with sensor 18 and processing unit 22 form a tunable light source or laser that is capable of operating at a plurality of predetermined and selectable wavelengths. The tunable light source is becomes a tunable optical transmitter with the addition of a modulator 24 that is coupled to loop 16. Modulator 24 allows information to be conveyed by the optical signals generated. Modulator 24 may be any one of a plurality of optical modulators, including, but not limited to a Mach-Zehnder interferometer type modulator. Modulator 24 may be one that complies with OC192 standards or other standards. OC192 standards define a data rate of approximately 10 Gbps. Modulator 29 is controlled by processing unit 22 via line 27. In a particularly advantageous embodiment of the invention, modulator 24 is a Mach-Zehnder interferometer type modulator and has associated therewith a radio frequency RF driver 26 that receives data and provides modulation signals to modulator 24 via line 31. With modulator 24, the resulting structure becomes a tunable optical transmitter providing a modulated output at output 29. As should be evident to those skilled in the art, the various elements may be separate discrete elements. In certain other advantageous embodiments of the invention, at least tunable filter 14, modulator 24 and coupler 20 may be provided on a single integrated optic substrate as shown in FIGS. 2 through 5. In addition, at least a portion of gain block 12 may also be provided on the same integrated optic device as indicated by dashed block 28 as shown in FIG. 1.

Figure 2:
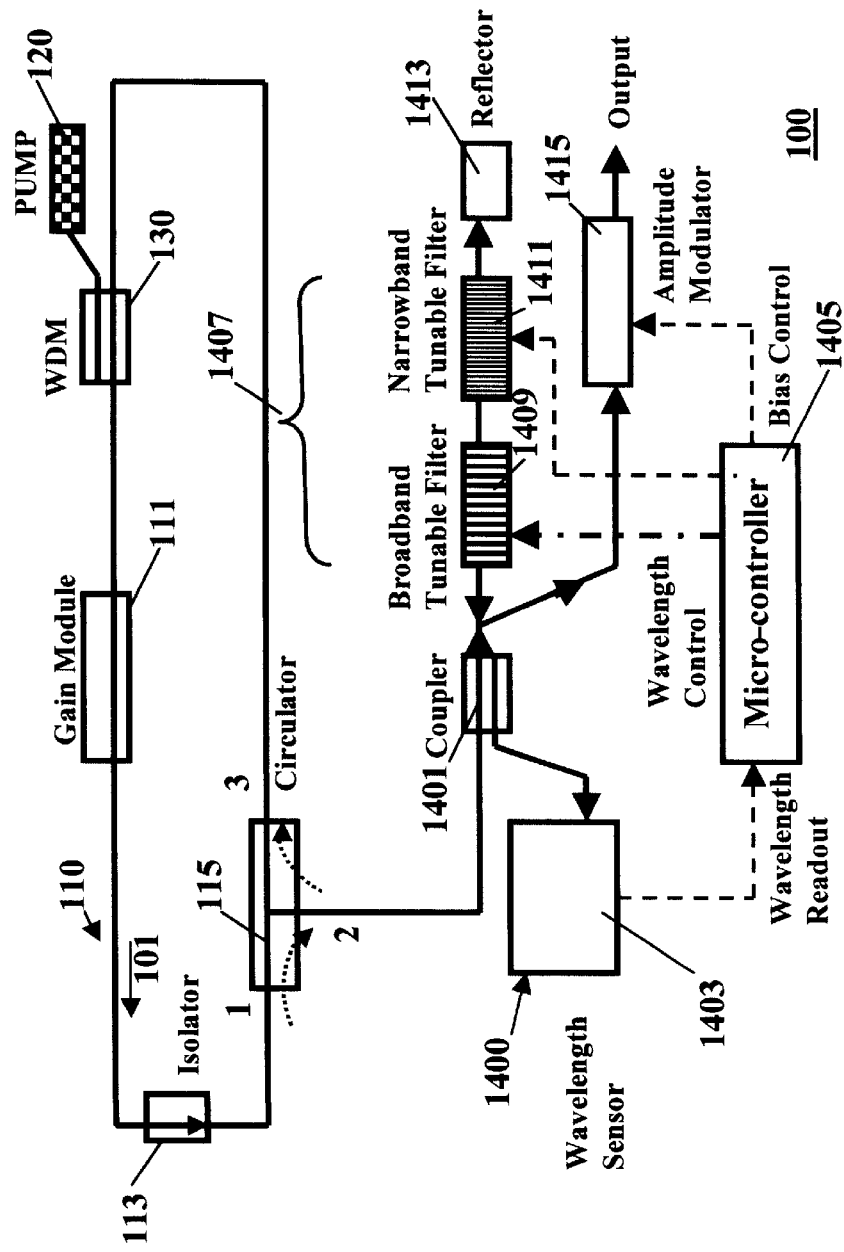
FIG. 2 depicts a first embodiment of a tunable transmitter in accordance with the principles of the invention.

Turning now to FIG. 2, a schematic representation of a tunable transmitter 100 in accordance with the principles of the invention is shown in greater detail. Tunable transmitter 100 includes a gain module 111 that receives pumping light from pump source 120. Transmitter 100 includes a ring resonator or loop 110 through which optical radiation flows in the direction indicated by arrow 101. Pump source 120 may be any one of a number of coherent light sources known in the art. Pump source 120 is coupled to ring resonator 110 through a wavelength division multiplexer (WDM) 130. Wavelength division multiplexer 130 may be a commercially available unit. It will be appreciated by those skilled in the art that coupling into ring resonator 110 is not limited to this particular type of coupler or method of coupling and may be accomplished by other types of couplers or methods. In particular, pump light from pump source 120 is coupled into doped optical fiber via a directional optical coupler or wave division multiplexer 130 that has a high coupling ratio at the pump wavelength and a low coupling ratio at the optical signal wavelength.

Ring resonator 110 includes a gain module or gain media 111. Gain media 111 include a length of rare earth doped optical fiber. In particular, the illustrative embodiment of the invention utilizes Erbium doped fiber. However, the invention is not limited to such fiber and may be practiced with other fiber including fiber doped with other rare earth or transition metal elements. A variety of rare earth and transition metal doped materials may be used in a wide variety of concentrations and fiber core configurations. In addition, various optical amplifiers can be used as the gain module 111.

An isolator 113 is shown coupled in ring resonator 110 to assure unidirectional transmission of optical signals through ring resonator 110. Isolator 113 may be any one of a number or known optical isolators. A circulator 115 is connected into rig resonator 110. Circulator 115 may be of a design known in the art. Circulator 115 includes three ports 1, 2, 3. Incoming optical signals at port 1 are allowed to circulate to port 2 and exit therefrom, but not to port 3. Input optical signals at port 2 are allowed to circulate to port 3 and exit therefrom, but not to port 1. Port 2 is coupled to tuning apparatus 1400 and to a tunable filter 1407.

Tuning apparatus 1400 includes a coupler 1401 that extracts a portion of the optical signal for use by a wavelength measuring apparatus. Wavelength measuring apparatus includes a wavelength sensor 1403 and a processing unit 1405. Processing unit 1405 utilizes a tuning algorithm to determine the wavelength of optical signals that are coupled to tuning apparatus 1400. Sensor 1403 receives a small portion of the optical signal from loop 110 via an optical coupler 1401. Optical sensor 1403 may be any one of a number of commercially available sensors, including, but not limited to Fabry-Perot type sensors. Sensor 1403 provides wavelength indicative signals to a processing unit 1405. Processing unit 1405 may be a commercially available micro-controller or microprocessor. Processing unit 1405 is programmed in accordance with an algorithm that utilizes the wavelength indicative signals from sensor 1402 to determine the wavelength of optical signals. Processing unit 1405 compares the determined wavelength with a selected predetermined wavelength and controls tunable filter 14 so that the wavelength of optical signals in loop 16 is the selected predetermined wavelength. The predetermined wavelengths that are selected can, for instance, be the channel wavelengths in a communication system. Processing unit 1405 can have the various predetermined wavelengths stored in a memory or processing unit 1405 and the selection of one of the predetermined wavelengths may be accomplished by any one of a variety of known ways to input selection information into a processing unit 22. In other embodiments of the invention, processing unit 1405 may have the predetermined wavelength information downloaded into memory, or a memory device may be programmed with the selection information and added to processing unit 1405. Although a memory for processing unit 1405 is not shown, it will be understood by those skilled in the art that processing unit 1405 may include one or more memories that may be of various types including read only memory and random access memory. In addition, processing unit 1405 may include one or more microprocessors.

A tunable filter 1407 is utilized to tune loop 110. Filter 1407 as shown in FIG. 2 is a multistage filter and more specifically is a two-stage reflective filter. Filter 1407 comprises a first tunable filter 1409 connected in cascade with a second tunable filter 1411. First tunable filter 1409 is a broadband tunable filter and second tunable filter 1411 is a narrow band tunable filter. Both filter 1409 and filter 1411 are bi-directional or reflective type filters. Various other tunable filters and combinations of filter stages may be utilized, but the two-filter arrangement shown in FIG. 1 is particularly advantageous. A reflector 1413 is coupled to the optical output of filter stage 1411 and reflects optical signals back through filter stages 1411, 1409 through bi-directional coupler 1401 into port 2 of circulator 115 and thus into loop 100. Reflector 1413 may comprise of one or more reflector surfaces or portions. In operation, the selectivity of the filter stage is improved since the light will pass around the loop 100 several times before the light exits loop 110 via circulator 115. Light exits the loop via amplitude modulator 1415. Modulator 1415 is a Mach-Zehnder interferometer type of modulator.

Micro-controller 1405 may be any one of number of programmable microprocessors that are commercially available along with its associated memory to contain programming algorithms that are utilized to provide the tuning to desired output wavelength frequencies. Micro-controller 1405 receives signals indicative of the wavelength of the output signal from wavelength sensor 1403. Micro-controller 1405 utilizes the signals to tune filters 1409, 1411 to a desired wavelength frequency. In addition, micro-controller 1405 provides bias control to modulator 1415.

Still further, micro-controller 1405 provides for current and temperature control of pump 120.

In a particularly advantageous embodiment of the invention, tunable transmitter 100 utilizes an acoustic optical tunable filter (AOTF) as sensor 1403 to provide wavelength sensing, however, the invention is not limited to embodiments having only an AOTF. With an AOTF as sensor 1403, a radio frequency generator, which is not shown in FIG. 2, is utilized to determine the wavelength indicative signals from sensor 1403. The radio frequency generator is controlled by processing unit 1405 in accordance with predetermined algorithms to determine the wavelength of optical signals on loop 110.

Figure 3:
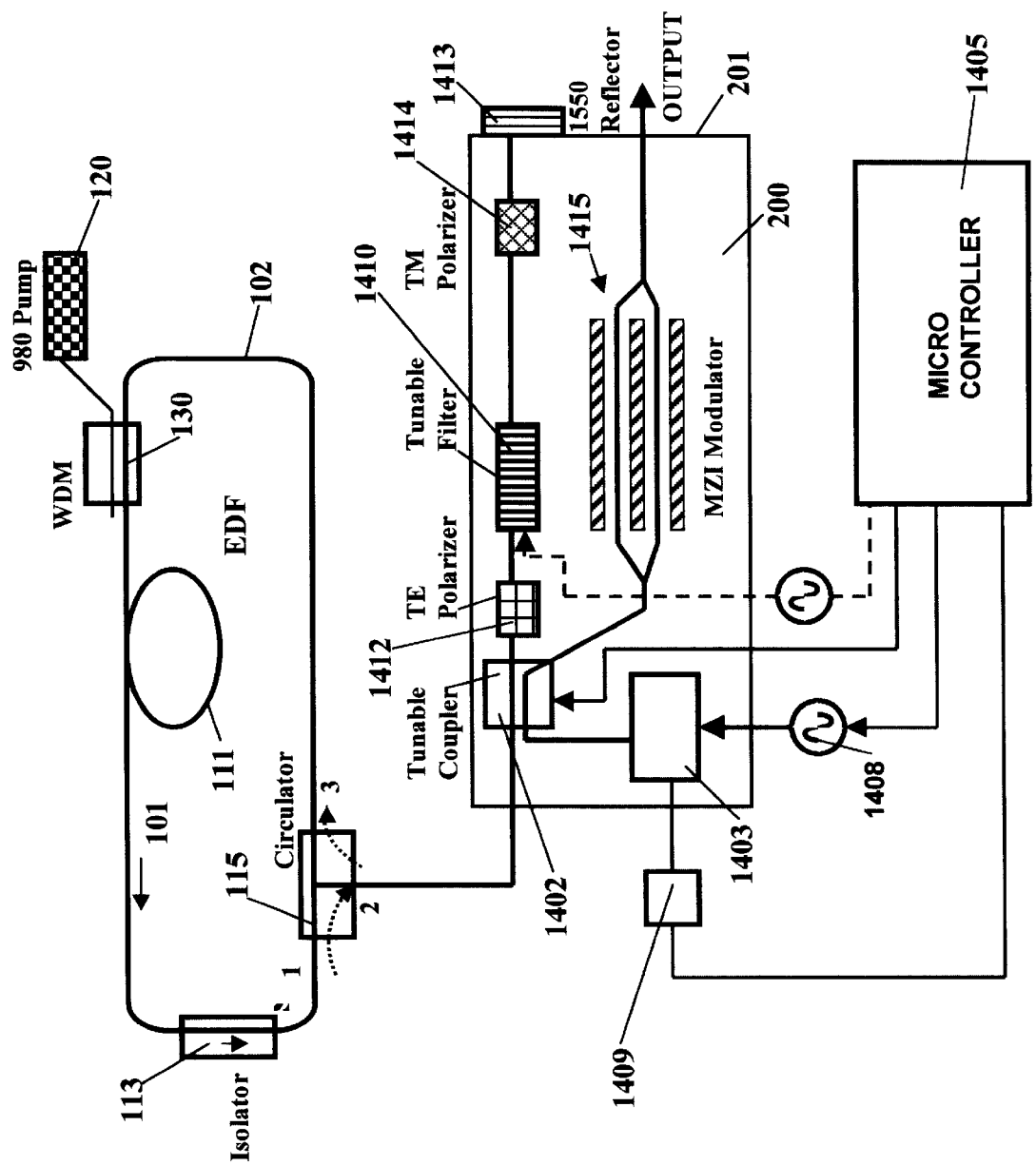
FIG. 3 depicts a second embodiment of a tunable transmitter in accordance with the principles of the invention.

A more specific implementation of the tunable transmitter of FIG. 2 is shown in FIG. 3. In FIG. 3, an AOTF 1410 is utilized in place of the two stage tunable filter 1407 of the transmitter of FIG. 2. However, AOTF 1410 is also a bi-directional reflective filter and provides better response than a single stage filter. In addition, an erbium doped fiber EDF is utilized as the gain module 111 of FIG. 1. Polarization maintaining optical fiber is utilized for the loop 102. It will, however be appreciated that in other embodiments of the invention, the optical fiber may not be polarization maintaining. Pump 120 provides light pulses at a wavelength of 980 nm to WDM 130. The gain media reacts to pumping light with asynchronous spontaneous emission and provides a broadband optical output of approximately 1510 to 1590 nm. The optical output of erbium doped fiber EDF is applied to an isolator 113 and to port 1 of circulator 115. In the embodiment of FIG. 2, a tunable coupler 1402, first polarizer 1412, tunable filter 1410, second polarizer 1414, and wavelength 1403 sensor form a tuner. The tuner and a modulator 1415 are provided as an integrated optic device on a single substrate 200. Tunable filter 1410 is an acousto-optic tuned filter (AOTF). Integrated AOTF's are known in the prior art. U.S. Pat. No. 5,452,314 describes various AOTF's. The disclosure of the '314 patent is incorporated herein by reference. AOTF's have been inadequate for DWM tunable filtering requirements in the past for several reasons including a too high insertion loss, typically 3–5 dB; a filter response that is not sufficiently narrow, i.e., the 3 dB bandwidth obtainable is typically 1–2 nm, whereas a bandwidth of under 0.4 nm is preferred; and inadequate suppression of side lobes, typical AOTF filters provide side lobe suppression of 15 to 20 dB., whereas suppression of 30 dB is preferred. In contrast to prior efforts to utilize an AOTF to tune lasers and optical transmitters, the AOTF of tunable filter 1410 has its optical waveguide terminated in a reflective surface 201 on substrate 200. Reflective surface 201 has a mirror 1413 formed thereon. A bi-directional path through filter 1410 significantly improves the bandwidth of the filter over uni-directional filters. As is conventional with AOTF's first and second polarizing filters 1412, 1414 are utilized. Polarizing filter 1412 is a TE polarizing filter and polarizing filter 1414 is a TM polarizing filter in the illustrative embodiment. A particular advantage of the reflective AOTF configuration is that the Doppler shift in frequency that occurs as light passes through the AOTF is compensated by the bi-directional passage of light through the AOTF. In other words, as the Doppler shift in one direction is opposite the Doppler shift in the return direction. Although it is known in the prior art to utilize two AOTF's in cascade to compensate for the Doppler shifting that occurs in an AOTF, it is always difficult to obtain an exact match between two AOTF's. However, by utilizing a reflective, bi-directional design, the Doppler shift may be precisely canceled out since the same filter is utilized twice. Accordingly, utilizing a reflective AOTF design eliminates Doppler shift. In addition, the effect of utilizing a bi-directional design for AOTF 1410 provides greater sidelobe suppression over a single filter design.

Further in accordance with the principles of the invention, the wavelength sensor 1403 utilized is a highly accurate wavelength sensor that also utilizes AOTF technology. Wavelength sensor 1403 is an AOTF. Associated with wavelength sensor or AOTF 1403 is an oscillator or frequency source 1408 that is controlled by micro- controller 1405, and a detector 1409. AOTF 1403, frequency source 1408, detector 1409 and micro-controller 1405 cooperatively operate in accordance with an algorithm to measure the optical wavelength with great precision. Micro-controller 1405 steps the frequency of frequency source 1408 from a first or minimum frequency to a second or maximum frequency. The stepped frequency is utilized as a modulation frequency applied to a surface acoustic wave device utilized in AOTF 1403. At each frequency step, the output of detector 1409 is measured by micro-controller 1405. The measured output of detector 1405 is utilized by micro-controller 1405 in accordance with a predetermined algorithm to determine the wavelength of the optical output of AOTF 1403.

In operation, tunable filter 1410 is utilized to adjust the output wavelength of the optical signals provided to modulator 1415. To assure that the wavelength of optical signals is a desired wavelength, AOTF 1403 is utilized to measure the actual wavelength of the optical signals. Micro-controller 1405 adjusts the tuning of filter 1410 in accordance with the measured wavelength and the desired wavelength.

It will be appreciated by those skilled in the art that the optical output may be taken prior to modulator 1415 to provide a tunable laser or light source. By taking the output after providing modulation utilizing the MZI modulator 1415, a tunable optical transmitter is provided.

As used herein, an integrated optic device is one of a class of devices for guiding and controlling light in thin film layers or in narrow waveguide channels formed in a suitable substrate material, which normally comprises a dielectric. In the specific embodiments of the invention described herein, the substrate 200 comprises an elongated crystalline substrate of Lithium Niobate $LiNbO_3$. The integrated optic device combines one or more functional elements combined or "integrated" onto a single substrate.

In the embodiment of the invention shown in the drawing FIG. 3, an optical tuner comprising tunable filter 1410 and modulator 1415 are integrated onto a single integrated optic substrate 200. Still further, in accordance with the invention, reflection surface or mirror 1413 is formed on substrate 200 as a micro-machined mirror. Still further in accordance with the invention, coupler 1402 coupling the optical signals to the wavelength sensor or AOTF 1403 is also integrated onto the integrated optical substrate 200. AOTF 1403 is also integrated onto substrate 200.

Figure 4:
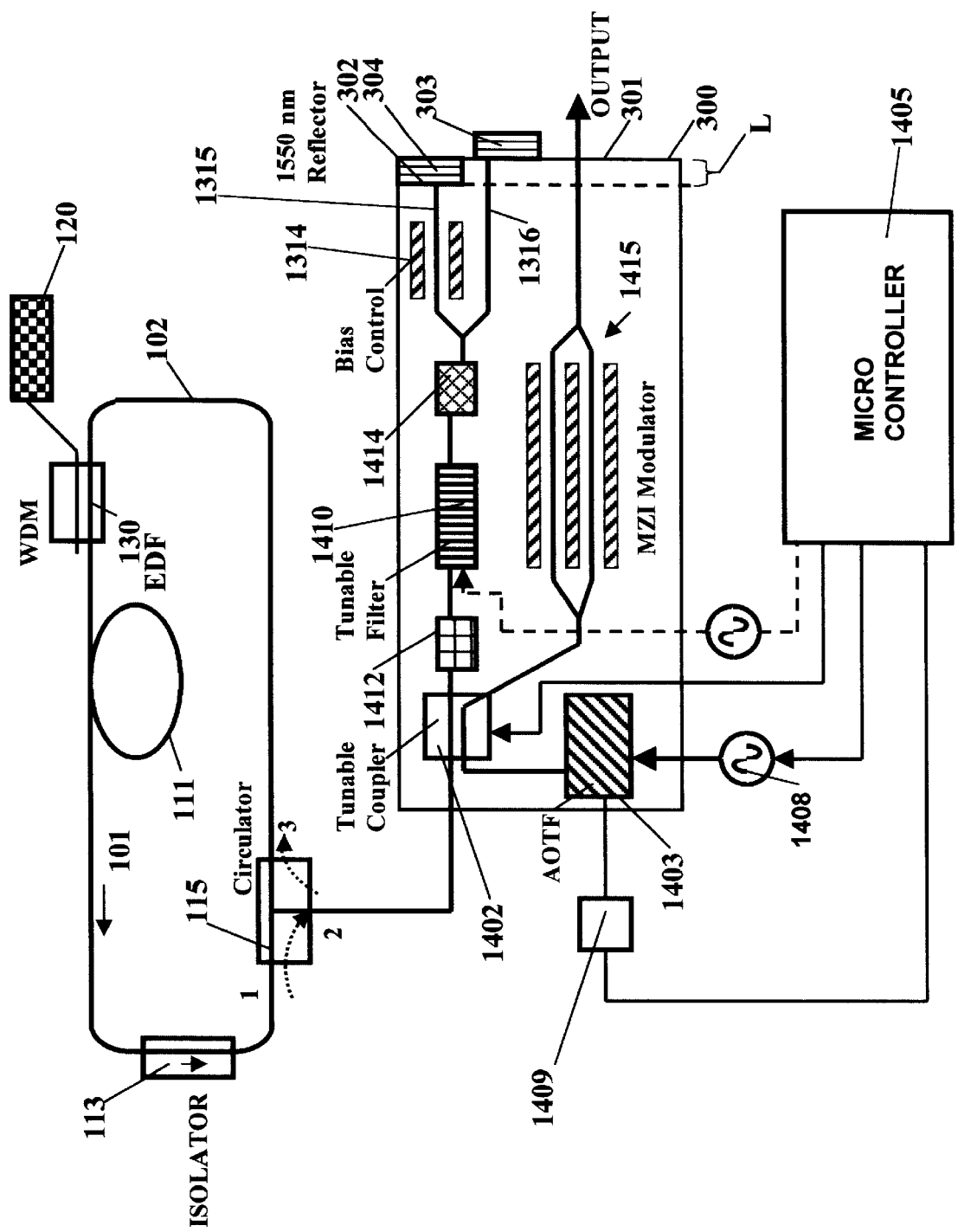
FIG. 4 depicts a third embodiment of a tunable transmitter in accordance with the principles of the invention.

Turning now to FIG. 4, another embodiment of the invention is shown. The structure of FIG. 4 differs from that of FIG. 3 only in that an unbalanced Mach-Zehnder interferometer 1314 is added and reflectors 303, 304 replace reflector 1413. In all other details, the structure and operation the embodiment of FIG. 4 is the same as the structure and operation of the embodiment of FIG. 3. The single stage tunable filter of FIG. 3 acts as a bandpass filter with a bandpass of approximately 2 nm. By adding unbalanced MZI 1314, the overall characteristics of the tuning filter are significantly improved. Unbalanced MZI 1314 operates as a comb filter that provides significantly narrower bandwidth in the output optical signal. In the embodiment shown, a bandwidth of 0.1 nm is achieved. Unbalanced MZI 1314 is implemented by providing different lengths for the optical waveguides 1315, 1316 that are part of the MZI 1314. The difference is waveguide lengths is achieved by micromachining reflective surfaces 301, 302 on substrate 300 that are spaced apart by a distance L. By selecting the distance L, the comb filter characteristics of MZI 1314 are determined. For example, with a $LiNbO_3$ substrate and L-5 mm, a comb filter having a bandwidth of 0.1 nm is obtained. Advantageously, MZI 1314 is integrated onto substrate 300 along with MZI modulator 1415, filter 1410, polarizers 1412, 1414, coupler 1402 and AOTF 1403.

Figure 5:
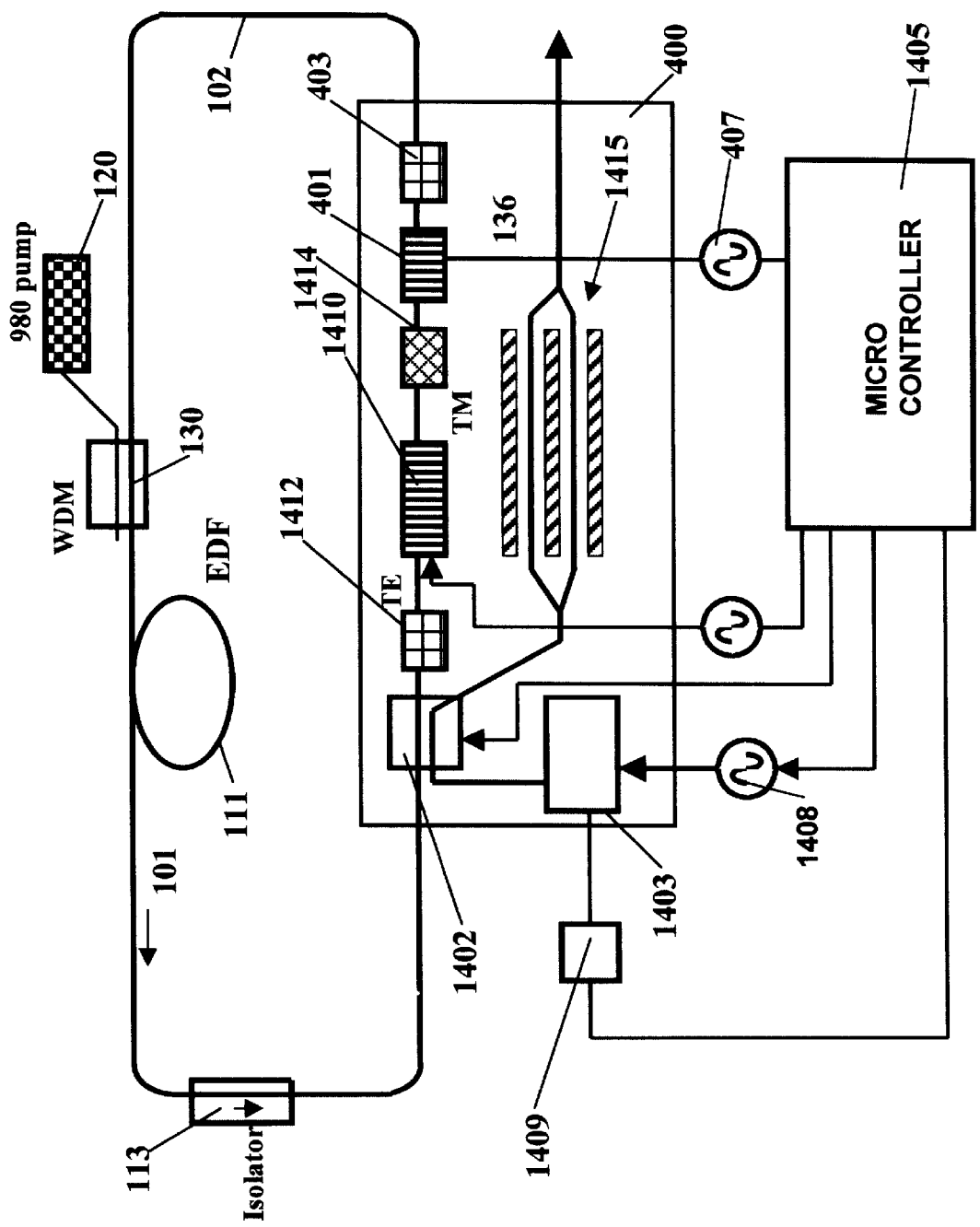
FIG. 5 depicts a fourth embodiment of a tunable transmitter in accordance with the principles of the invention.

Turning now to FIG. 5, another embodiment of a tunable transmitter and an integrated optic device in accordance with the invention is shown. In the embodiment of FIG. 5, what may be termed a "feed through" configuration is utilized rather than the "tapped" configuration of FIGS. 2, 3, and 4. In the configuration of FIG. 5, a tunable filter is provided by cascaded AOTF's 1410, 401. Cascaded AOTF's 1410, 401 are inserted into the optic loop formed by pump 120, erbium doped fiber 111, and isolator 13 tunable coupler 1402 is coupled into the optic loop and couples optical signals from the loop to a modular that is implemented as an MZI modulator 1415 and to a wavelength measuring arrangement including AOTF 1403. Connected in cascade with tunable coupler 1402 and the optic loop are first and second AOTF, 1410, 401. A first polarizer 1412 of a first polarization type precedes AOTF 1410. A second polarizer 1414 of a second polarization type follows AOTF 1410 and precedes AOTF 401. A third polarizer 403 of the first polarization type follows AOTF 401. Micro-controller 1405, in addition to controlling modulation frequencies of AOTF 1403, 1410 also controls the modulation frequency of AOTF 401 by controlling oscillator 407. The two stage filtering provided by AOTF's 1410, 401 provides narrow bandwidth. The substrate 400 includes coupler 1402, polarizers 1412, 1414, 403, AOTF's 1410, 401, 1403, and MZI modulator 1405.

In the various illustrative embodiments, the substrates 200, 300, 400 are $LiNbO_3$. It will be appreciated by those skilled in the art that other substrates may be utilized.

The invention has been described in terms of several embodiments. It will be apparent to those skilled in the art that various changes and modifications may be made to the embodiments shown and described without departing from the spirit or scope of the invention. For example, but not by way of limitation, although the various tunable filters comprise two filtering stages, more or less filter stages may be employed. Also, by way of example, and not by way of limitation, the processing units 22, 1405 may comprise one or more processors or microprocessors and one or more memories and/or memory types. Still further by way of example, but not by way of limitation, various other combinations of filters may be used. It is intended that the invention includes all such changes and modifications and other changes and modifications that are not specifically mentioned. It is further intended that the invention not be limited in scope to the embodiments shown and described, but that the invention is limited in scope only by the claims appended hereto.

What is claimed is:

1. A tuner for tuning broadband optical input signals to a desired one optical wavelength selected from a plurality of predetermined optical wavelengths, said tuner comprising:

a control processor receiving wavelength indicative signals and processing said wavelength indicative signals to generate wavelength determining signals in accordance with a predetermined algorithm, such that the wavelength represented by said wavelength indicative signals corresponds to a desired one optical wavelength of said predetermined optical wavelengths;

a tunable filter receiving said optical input signals coupled to said processor and responsive to said wavelength determining signals for filtering said optical input signals to provide output optical signals at said desired one optical wavelength; and an optical wavelength sensor coupled to said tunable filter to receive said output optical signals and to produce said wavelength indicative signals that are indicative of the wavelength of said output optical signals;

whereby said processor, said tunable filter and said optical wavelength sensor form a control loop, controlled by said processor such that said tunable filter is tuned to said desired one optical.

2. A tuner in accordance with claim 1, wherein:

said wavelength sensor comprises an acousto-optic tunable filter.

3. A tuner in accordance with claim 2, wherein:

said optical wavelength sensor comprises a tunable radio frequency signal source coupled to said acousto-optic tunable filter for supplying radio frequency signals thereto; and said processor controls said tunable radio frequency source, whereby said acousto-optic tunable filter, said tunable radio frequency source and said processor cooperate to determine the wavelength of said for receiving radio frequency control signals, said radio frequency control signals being provided in accordance with said predetermined algorithm.

4. A tuner in accordance with claim 2, wherein:

said tunable filter comprises an acousto-optic tunable filter stage.

5. A tuner in accordance with claim 2, wherein:

said tunable filter comprises a first tunable filter stage and a second tunable filter stage.

6. A tuner in accordance with claim 5, wherein;

said first tunable filter stage comprises a broadband tunable filter and said second tunable filter stage comprises a narrow band tunable filter.

7. A tuner in accordance with claim 6, wherein:

said first and second tunable filter stages are each bi-directional filters;

and said tuner comprises:

a reflective surface; and wherein:

said first and said second tunable filter stages are coupled in cascade to each other and to said reflective surface.

8. A tuner in accordance with claim 6, wherein:

said second tunable filter stage comprises an unbalanced Mach-Zehnder interferometer.

9. A tuner in accordance with claim 8, wherein:

said first tunable filter stage comprises an acousto-optic tunable filter stage, a first polarization filter coupled to one side of said acousto-optic tunable filter stage, and a second polarization coupled to the other side of said acousto-optic tunable filter stage, said first polarization filter being of one polarization type and said second polarization filter being of a second polarization type.

10. A tuner in accordance with claim 6, wherein:

said first tunable filter stage comprises a first acousto-optic tunable filter; and said second tunable filter stage comprises a second acousto-optic tunable filter.

11. A tuner in accordance with claim 10, wherein:

said first and said second tunable filter stages are coupled in cascade.

12. A tuner in accordance with claim 11, comprising:

a first polarization filter of a first type coupled to said first tunable filter stage;

a second polarization filter of a second type coupled between said first and said second tunable filter stages; and a third polarization filter of said first type coupled to said second tunable filter stage.

* * * * *